United States Patent
Orner et al.

(10) Patent No.: US 8,217,497 B2
(45) Date of Patent: Jul. 10, 2012

(54) FIN DIFFERENTIAL MOS VARACTOR DIODE

(75) Inventors: Bradley A. Orner, Cambridge, VT (US); Edward J. Nowak, Essex Junction, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 11/623,922

(22) Filed: Jan. 17, 2007

(65) Prior Publication Data

US 2008/0169495 A1 Jul. 17, 2008

(51) Int. Cl.
*H01L 29/93* (2006.01)
(52) U.S. Cl. .. 257/599; 257/600; 257/601; 257/E29.344
(58) Field of Classification Search .................. 257/594, 257/595, 599, 601, E29.344, E21.364, E27.049, 257/600
See application file for complete search history.

(56) References Cited

U.S. PATENT DOCUMENTS

| 5,055,889 | A | 10/1991 | Beall |
| 6,316,305 | B1 * | 11/2001 | Noble ............................ 438/237 |
| 6,458,662 | B1 * | 10/2002 | Yu .................................. 438/286 |
| 6,500,744 | B2 * | 12/2002 | Gonzalez et al. ............. 438/595 |
| 6,835,967 | B2 * | 12/2004 | Yeo et al. ....................... 257/104 |
| 6,855,588 | B1 * | 2/2005 | Liao et al. ..................... 438/197 |
| 6,943,399 | B1 | 9/2005 | Figueria et al. |
| 6,947,275 | B1 | 9/2005 | Anderson et al. |
| 2003/0142459 | A1 | 7/2003 | Laws |
| 2005/0161769 | A1 | 7/2005 | Coolbaugh et al. |

FOREIGN PATENT DOCUMENTS

JP 5-145338 6/1993

* cited by examiner

*Primary Examiner* — Robert Huber
(74) *Attorney, Agent, or Firm* — Gibb I.P. Law Firm, LLC; Richard M. Kotulak, Esq.

(57) ABSTRACT

The embodiments of the invention provide a structure, method, etc. for a fin differential MOS varactor diode. More specifically, a differential varactor structure is provided comprising a substrate with an upper surface, a first vertical anode plate, and a second vertical anode plate electrically isolated from the first vertical anode plate. Moreover, a semiconductor fin comprising a cathode is between the first vertical anode plate and the second vertical anode plate, wherein the semiconductor fin, the first vertical anode plate, and the second vertical anode plate are each positioned over the substrate and perpendicular to the upper surface of the substrate.

9 Claims, 10 Drawing Sheets

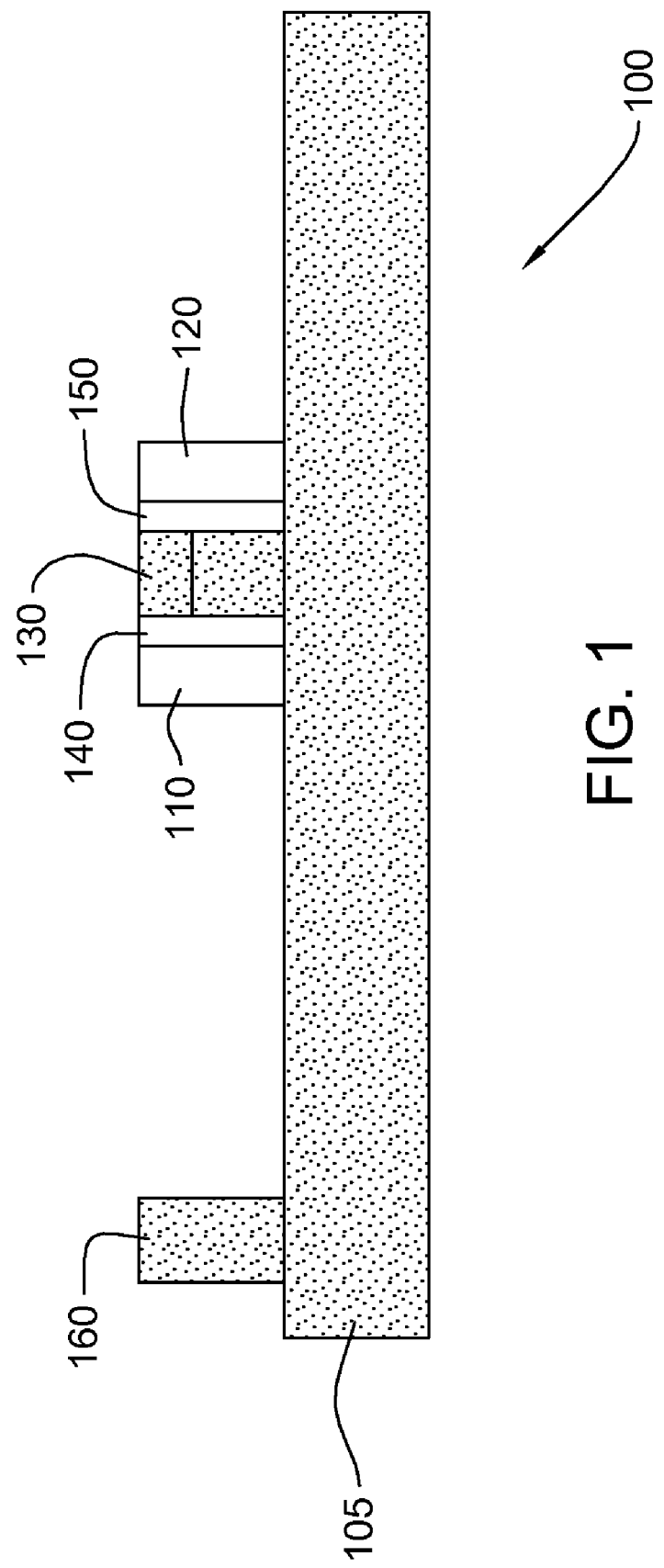

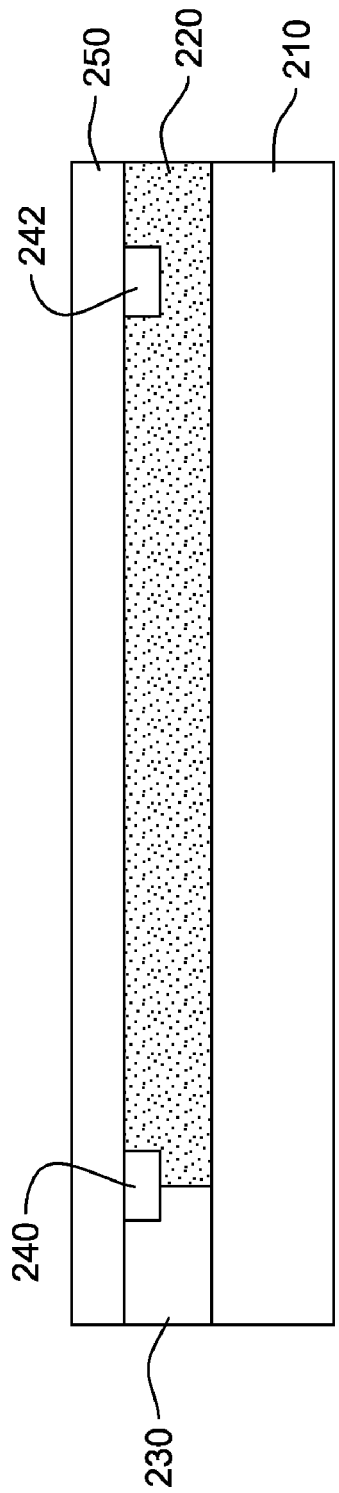
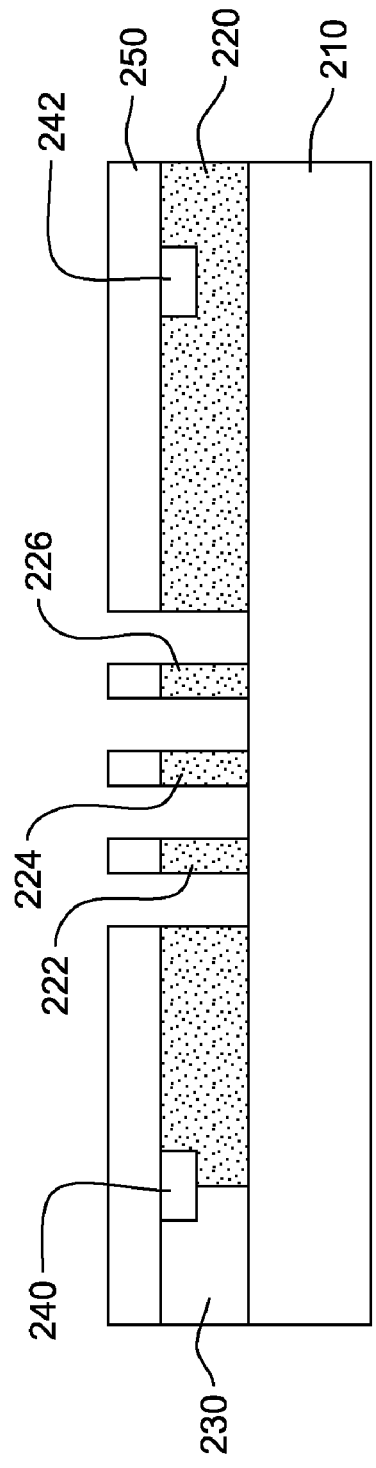

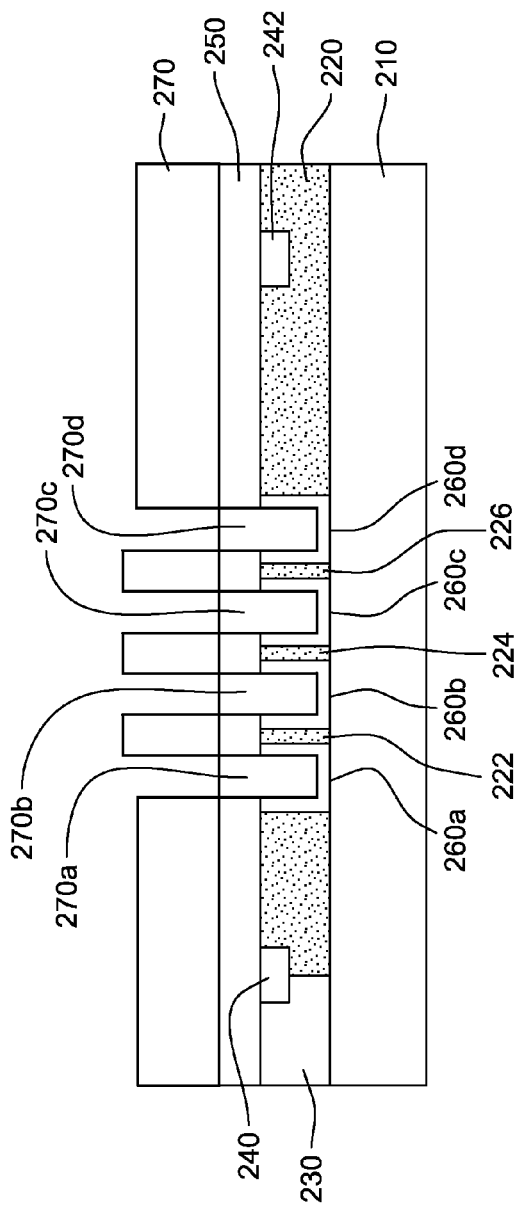
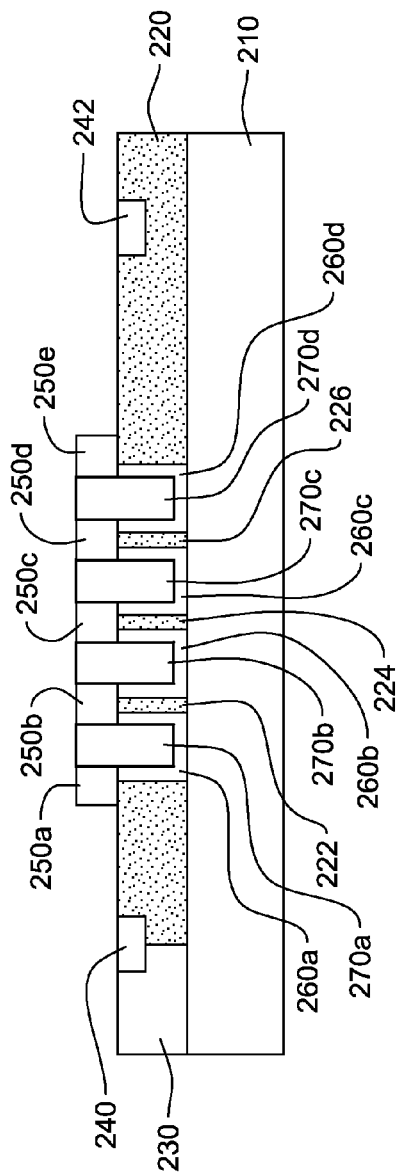
FIG. 2C
FIG. 2D

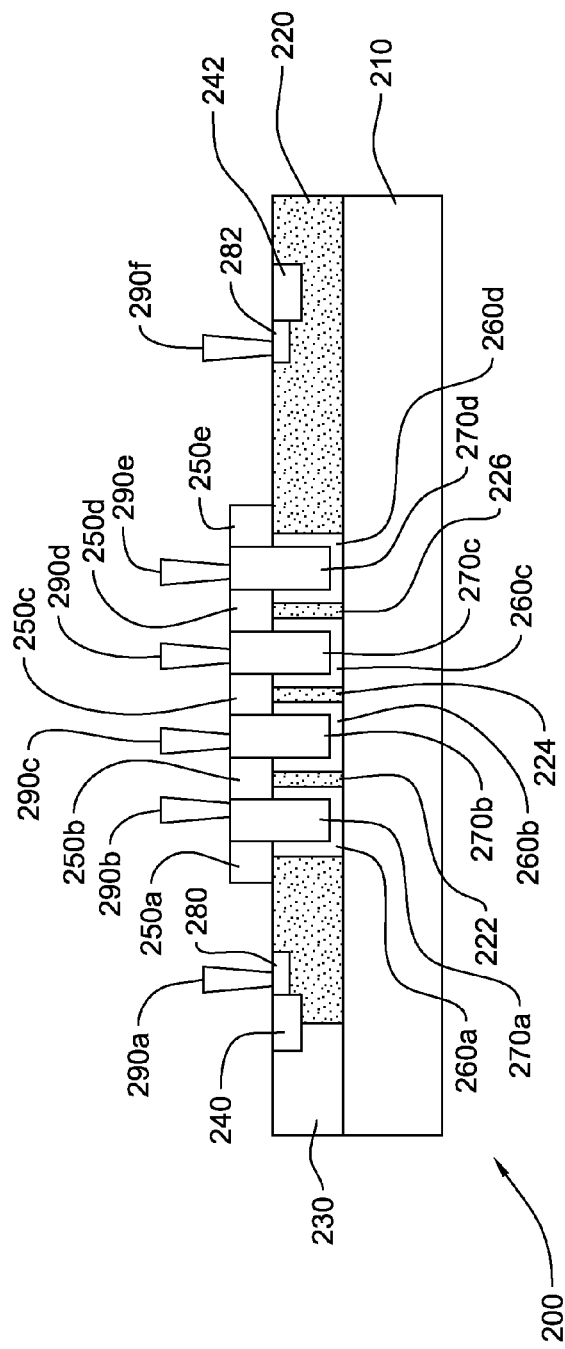
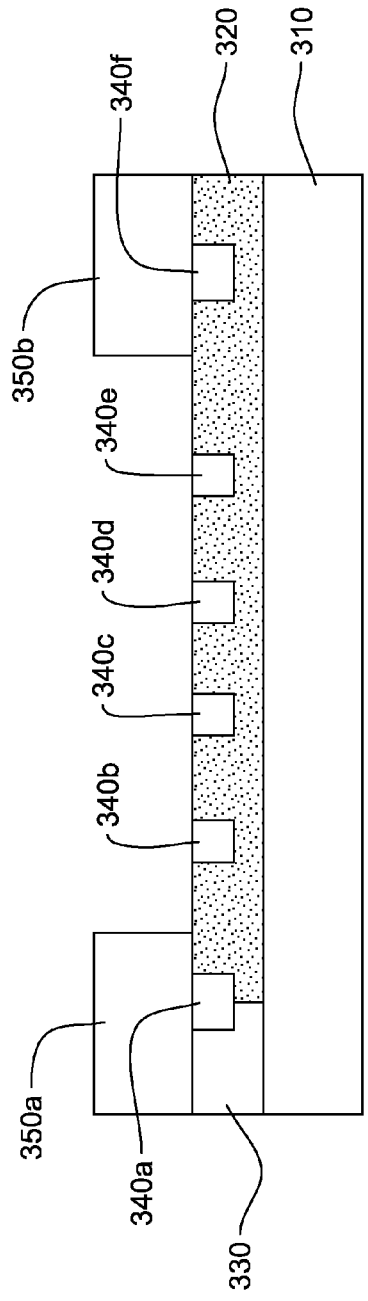
FIG. 2E
FIG. 3A

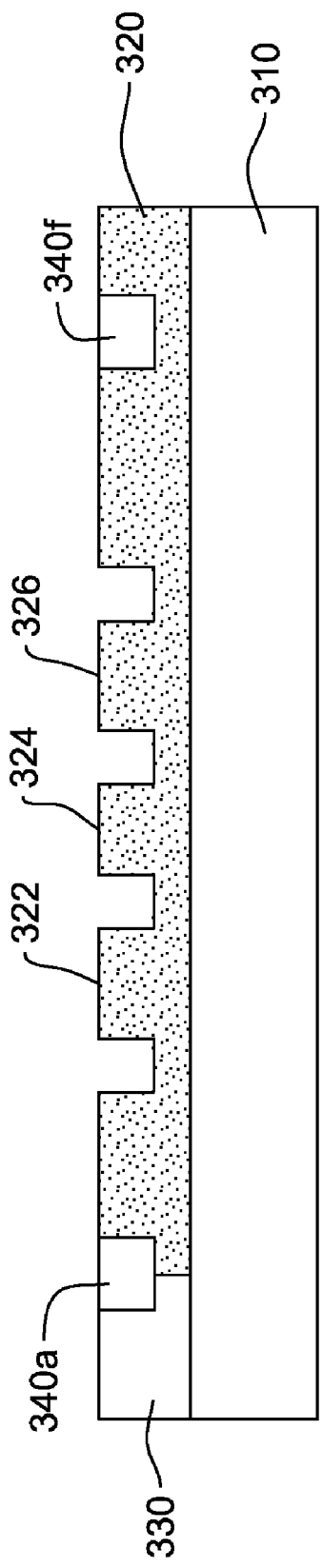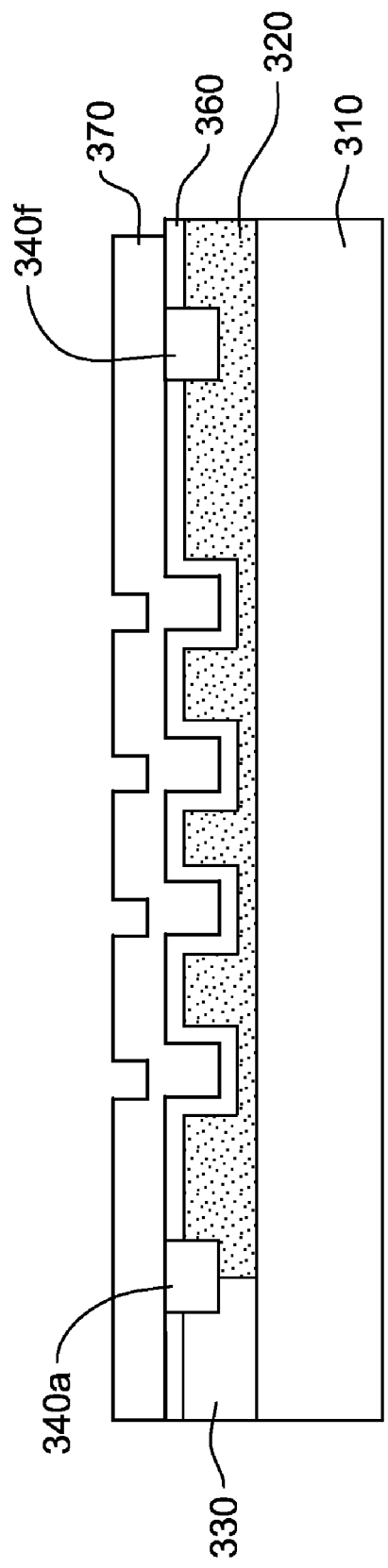

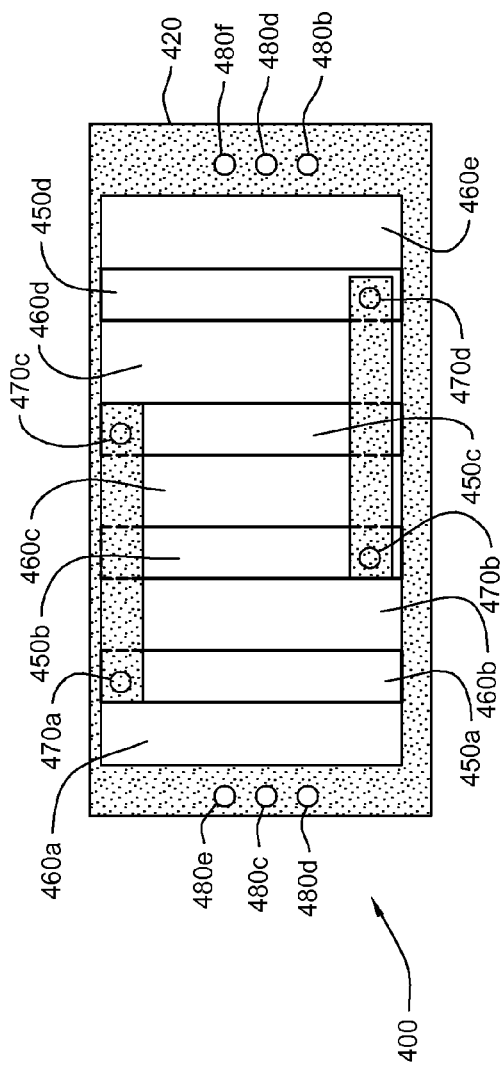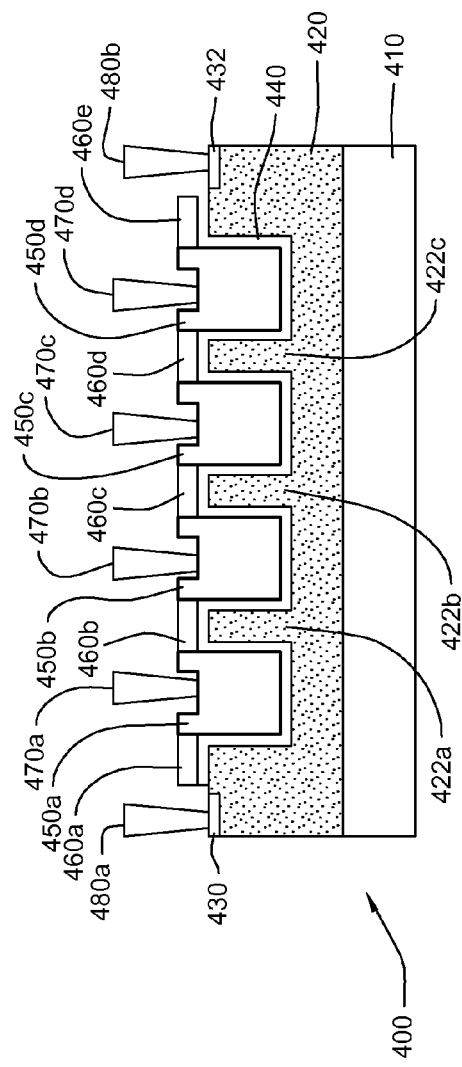

FIN DIFFERENTIAL MOS VARACTOR DIODE

BACKGROUND

1. Field of the Invention

The embodiments of the invention provide a structure, method, etc. for a fin differential metal oxide semiconductor (MOS) varactor diode.

2. Description of the Related Art

Variable reactor (varactor) diodes are popular devices in analog/mixed signal technologies. Such diodes are components in voltage-controlled oscillator (VCO) and phase-locked loop (PLL) circuits. A figure of merit is quality factor (Q), which is improved by reducing parasitic resistances and capacitances. Commonly these devices are used in differential mode, and Q can be improved by designing the device specifically for this use.

One method of reducing parasitic resistance is to provide separate positive and negative signal anodes with a common cathode, usually with interdigitated planar anodes.

This is formed by interdigitated anode fingers, alternating positive and negative terminals. Parasitic resistance is decreased between positive and negative terminals as signal path through cathode buried layer and sinker contact is eliminated. However, the signal path still includes a lateral component. In other words, resistance is reduced down to and through the cathode and cathode contact, but there is still a significant lateral resistance between anodes.

SUMMARY

The embodiments of the invention provide a structure, method, etc. for a fin differential MOS varactor diode. More specifically, a differential varactor structure is provided comprising a substrate with an upper surface, a first vertical anode plate, and a second vertical anode plate electrically isolated from the first vertical anode plate. Moreover, a semiconductor fin comprising a cathode is between the first vertical anode plate and the second vertical anode plate, wherein the semiconductor fin, the first vertical anode plate, and the second vertical anode plate are each positioned over the substrate perpendicular to the upper surface of the substrate.

Furthermore, a first insulator plate is provided between the first vertical anode plate and the semiconductor fin; and, a second insulator plate is provided between the second vertical anode plate and the semiconductor fin. The structure may also include one or more additional vertical anode plates proximate the second vertical anode plate and one or more additional semiconductor fins between the second vertical anode plate and the additional vertical anode plates. The additional vertical anode plates and the additional semiconductor fins are positioned over the substrate perpendicular to the upper surface of the substrate. Moreover, a top of the first vertical anode plate, a top of the second vertical anode plate, and a top of the additional vertical anode plates are planar with each other. The structure may further include spacers between the semiconductor fin and the first vertical anode plate and the second vertical anode plate, wherein the spacers separate the semiconductor fin from the first vertical anode plate and the second vertical anode plate.

A method of forming a differential varactor structure is also provided, wherein the method begins by forming a substrate comprising an upper surface. Next, a semiconductor fin is formed over the substrate perpendicular to the upper surface of the substrate. First and second vertical anode plates are then formed proximate the semiconductor fin, such that the first and second vertical anode plates are over the substrate and perpendicular to the upper surface of the substrate. The first and second vertical anode plates are formed such that the semiconductor fin is between the second vertical anode plate and the first vertical anode plate, and such that the second vertical anode plate is electrically isolated from the first vertical anode plate. Thus, the forming of the semiconductor fin comprises forming the semiconductor fin such that the semiconductor fin allows the first vertical anode plate to be proximate and electrically isolated from the second vertical anode plate.

Prior to the forming of the first vertical anode plate and the second vertical anode plate, the method forms a first insulator plate and a second insulator plate, such that the first insulator plate is on a first sidewall of the semiconductor fin, and such that the second insulator plate is on a second sidewall of the semiconductor fin. The first and second insulator plates are formed such that the first insulator plate is between the semiconductor fin and the first vertical anode plate, and such that the second insulator plate is between the semiconductor fin and the second vertical anode plate.

Furthermore, prior to the forming of the first and second vertical anode plates, an insulator can be formed over the semiconductor fin. The forming of the first and second vertical anode plates can include forming the first and second vertical anode plates above the insulator, such that the insulator allows the first and second vertical anode plates to be self-aligned to a top of the semiconductor fin.

Also prior to the forming of the first and second vertical anode plates, spacers can be formed over the semiconductor fin. The forming of the first and second vertical anode plates can include forming the first and second vertical anode plates such that the spacers are between the semiconductor fin and the first and second vertical anode plates.

Additionally, the forming of the semiconductor fin includes forming one or more additional semiconductor fins over the substrate perpendicular to the upper surface of the substrate. The forming of the second vertical anode plate includes forming one or more additional vertical anode plates over the substrate perpendicular to the upper surface of the substrate, such that the additional semiconductor fin is between the second vertical anode plate and the additional vertical anode plate.

Accordingly, the embodiments of the invention form two electrically isolated vertical anode plates on opposite sides of a semiconductor fin structure. The silicon fin forms the common cathode. The fin structure allows the two capacitors to be placed in close proximity. This reduces the parasitic resistance much further than could be achieved with an interdigitated planar structure.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 1 is a diagram illustrating a differential MOS varactor;

FIGS. 2A, 2B, 2C, 2D, and 2E are diagrams illustrating a method of forming a self-aligned differential MOS varactor;

FIGS. 3A, 3B, 3C, 3D, and 3E are diagrams illustrating a method of forming a non self-aligned differential MOS varactor;

FIG. 4A is a diagram illustrating a top view of a self-aligned differential MOS varactor;

FIG. 4B is a diagram illustrating a cross-sectional view of the self-aligned differential MOS varactor of FIG. 4A;

DETAILED DESCRIPTION OF PREFERRED EMBODIMENTS

Figure 3D:
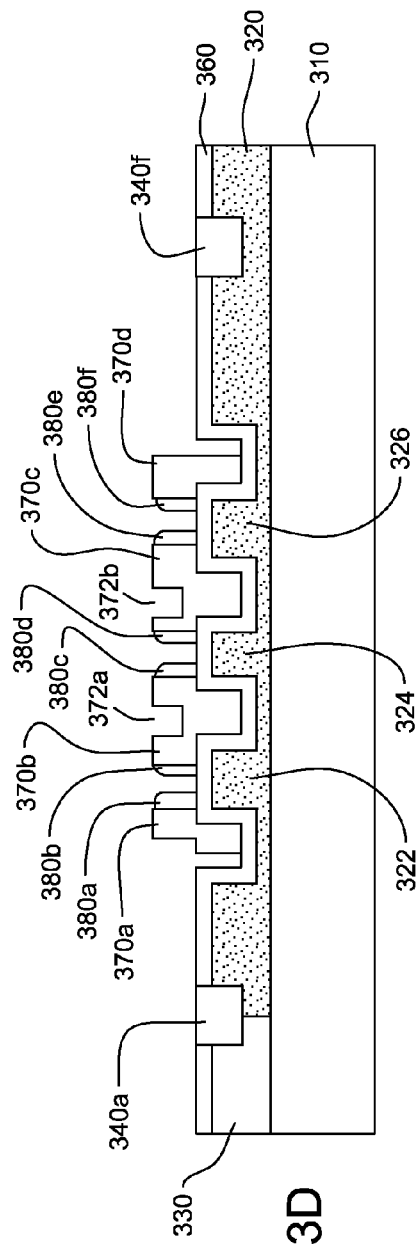

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention form two electrically isolated vertical anode plates on opposite sides of a semiconductor fin structure. The silicon fin forms the common cathode. The fin structure allows the two capacitors to be placed in close proximity. This reduces the parasitic resistance much further than could be achieved with an interdigitated planar structure.

A MOS varactor diode is formed with a series of one or more sets of: a first capacitor plate of semiconductor material (also referred to herein as the "fin"), an insulating dielectric (also referred to herein as the "insulator") on opposite vertical surfaces of said semiconductor followed by a second capacitor plate (also referred to herein as the "first vertical anode plate") on one vertical surface and a third capacitor plate (also referred to herein as the "second vertical anode plate") on the opposite vertical surface, moreover being constructed such that each capacitor plate is electrically isolated from the others.

The second and third capacitor plates are separated on the top of the semiconductor material (the fin) by an insulating layer that fully covers the top of the fin allowing the capacitor plates to be self-aligned to the top of the fin. The second and third capacitor plates extend over the top of the fin some distance, and are separated by an insulating spacer formed on the sidewalls of the edge of the fin.

A method is provided for integrating a vertical fin MOS structure with planer isolation structure in which the same lithography and etch used to define the shallow trench isolation defines the vertical fin and the same lithography and etch steps are used to define the gate poly in both the vertical and planar structures. A method is also provided for forming a vertical fin MOS structure of minimal topography with separate self-aligned gates on opposite fin surfaces using a chemical mechanical polishing (CMP) process.

As illustrated in FIG. 1, a differential MOS varactor 100 is formed comprising a fin 130 on a substrate 105. A positive plate 110 (also referred to herein as the "first vertical anode plate") and a negative plate 120 (also referred to herein as the "second vertical anode plate") are also provided on opposite sides of a fin structure 130 (also referred to herein as the "fin"). A first insulator 140 and a second insulator 150 are also provided. Specifically, the first insulator 140 is between the positive anode plate 110 and the fin structure 130; and, the second insulator 150 is between the negative anode plate 120 and the fin structure 130. Additionally, the differential MOS varactor 100 includes a Vtune component 160 proximate the positive plate 110. Parasitic resistance from between terminals is minimized. Also, the "plates" and "fins" discussed herein are generally 3-dimensional rectangular structures that extend perpendicularly from the layer on which they are formed. Thus, with the above structure, the plates and fins discussed herein have a height above the substrate that is greater than their cross-sectional width.

Referring now to FIGS. 2A-2E, a method is illustrated of forming a self-aligned differential MOS varactor 200. The method begins by completing a standard complementary metal oxide semiconductor (CMOS) or bipolar CMOS (BiCMOS) process through wells, including subcollector and deep trench (DT) if present, shallow trench isolation (STI), planarization, and well implant. The varactor body is formed with an n-type well (NW) implant. A nitride layer is deposited on top of a pad oxide. The nitride layer will serve as a chemical mechanical polish (CMP) stop and a silicide block. The thickness of the nitride layer must be sufficient such that nitride remains at the time of silicide formation. Similar methods are described in United States Patent Application Publication No. 2005/0161769 to Coolbaugh et al., which if fully incorporated herein by reference.

Specifically, as illustrated in FIG. 2A, a first STI region 240 is formed in a p-silicon substrate 210 by a method known to the art. An NW layer 220 and a p-type well (BF) component 230 are formed in a p-silicon substrate 210, for example by ion implantation. The NW layer 220 is proximate the BF component 230, wherein the NW layer 220 and the BF component 230 are substantially equal in height and may extend to a depth underneath the STI region 240. The first STI region 240 is formed where the NW layer 220 contacts the BF component 230. Additionally, additional STI regions 242 are formed in an upper portion of the NW layer 220; and, a nitride layer 250 is formed over the BF component 230, the NW layer 220, the first STI region 240, and the second STI region 242.

Next, with a first new mask level, a fin pattern is defined in photoresist, the pattern thereby being transferred into the nitride 250 and silicon 220 by means of an etch. Lithography and etch are similar to those used in the STI and is known to the art. Thus, as illustrated in FIG. 2B, fins 222, 224, and 226 are formed in the NW layer 220.

The method then grows a thermal oxide. To minimize the thermal cycle, rapid thermal oxidation (RTO) or high pressure oxidation (HiPOX) may be performed. Polysilicon is deposited, wherein the polysilicon is either in-situ doped or doped by implantation after deposition.

Specifically, as illustrated in FIG. 2C, oxide members 260a, 260b, 260c, and 260d are formed in the NW layer 220. The oxide members 260a and 260b are on opposite sidewalls of the fin 222; the oxide members 260b and 260c are on opposite sidewalls of the fin 224; and, the oxide members 260c and 260d are on opposite sidewalls of the fin 226. Moreover, polysilicon or other conductor 270 is deposited over the nitride layer 250 and the oxide members 260a, 260b, 260c, and 260d. As such, polysilicon members 270a, 270b, 270c, and 270d are formed on the oxide members 260a, 260b, 260c, and 260d, respectively. Top surfaces of the polysilicon members 270a, 270b, 270c, and 270d are approximately planar with a top surface of the nitride layer 250. The fin 222 is between the polysilicon members 270a and 270b; the fin 224 is between the polysilicon members 270b and 270c; and, the fin 226 is between the polysilicon members 270c and 270d.

CMP is subsequently performed on the polysilicon, stopping in the nitride. With a second new mask level, the method masks the structure and etches the nitride film stopping on the pad oxide. As illustrated in FIG. 2D, the polysilicon 270 is removed above the nitride layer 250, wherein the polysilicon members 270a, 270b, 270c, and 270d remain at and below the top surface of the nitride layer 250. Furthermore, portions of the nitride layer 250 are removed by an anisotropic etch such that only nitride members (i.e., spacers) 250a, 250b, 250c, 250d, and 250e remain proximate the polysilicon members 270a, 270b, 270c, and 270d. The nitride members 250a and 250b are on opposite sidewalls of the polysilicon member 270a; the nitride members 250b and 250c are on opposite sidewalls of the polysilicon member 270b; the nitride members 250c and 250d are on opposite sidewalls of the polysilicon member 270c; and, the nitride members 250d and 250e are on opposite sidewalls of the polysilicon member 270d.

Following this, CMOS or BiCMOS processing is continued, including gate oxidation, areas of polysilicon (PC), spacers, extensions, and any bipolar processing. The n+ source/drain (S/D) implant is used in the body contact 280 and 282. Silicide formation is performed, wherein silicide on top of the fins is blocked by nitride spacers 250a-250e. The method then contacts the top of the polysilicon. As illustrated in FIG. 2E, an n+ region 280 is formed in a top portion of the NW layer 220, wherein the n+ region 280 is adjacent the first STI region 240, and wherein the n+ region 280 is between the first STI region 240 and the fin 222. An additional n+ region 282 is also formed in the top portion of the NW layer 220, wherein the n+ region 282 is adjacent the second STI region 242, and wherein the n+ region 282 is between the second STI region 242 and the fin 226. Additionally, metal contacts 290a-290f (also referred to herein as "Vtune components" or "vertical anode plate(s)") are formed by any manner known to the art. Specifically, the contact 290a is formed on the region 280; the contact 290b is formed on the polysilicon member 270a; the contact 290c is formed on the polysilicon member 270b; the contact 290d is formed on the polysilicon member 270c; the contact 290e is formed on the polysilicon member 270d; and, the contact 290f is formed on region 282. Similar to the differential MOS varactor 100 shown in FIG. 1, each fin is between a pair of vertical anode plates.

Referring now to FIGS. 3A-3E, as an alternative embodiment, a method is illustrated of forming a non self-aligned differential MOS varactor 300. The method shown in FIGS. 3A-3E begins by completing a CMOS or BiCMOS process through wells. NW 320 is used for the varactor body. The 322, 324, and 326 fin structures are defined using RX etch and filled with STI 340. Using a new mask level, a window is defined in resist over the structure. More specifically, as illustrated in FIG. 3A, an NW layer 320 and a BF component 330 are formed on a p-silicon substrate 310. The NW layer 320 is proximate the BF component 330, wherein the NW layer 320 and the BF component 330 are substantially equal in height. STI regions 340a, 340b, 340c, 340d, 340e, and 340f are formed in upper portions of the NW layer 320. The STI region 340a is formed in upper portions of the NW layer 320 and the BF component 330, where the NW layer 320 contacts the BF component 330. Additionally, a photoresist 350a and 350b is formed over substantially the entire surface of the substrate, being patterned to remove the resist of regions 340b, 340c, 340d, and 340e.

Next, the STI regions that are not under a resist are removed, for example with a hydrofluoric acid (HF) etch. The resist is stripped and field effect transistor (FET) processing is continued. Specifically, as illustrated in FIG. 3B, the STI regions 340b, 340c, 340d, 340e and the resists 350a and 350b are removed. As such, fins 322, 324, and 326 are formed in the NW layer 320.

Following this, a FET gate oxidation and polysilicon deposition forms a MOS structure over the fins. As illustrated in FIG. 3C, an oxide layer 360 is formed in upper portions of the BF component 330 and the NW layer 320, such that fins 322, 324, and 326 are covered by the oxide layer 360. Moreover, a polysilicon layer 370 is formed on the oxide layer 360, the STI region 340a, and the STI region 340f.

A photolithography and polysilicon etch is subsequently used to separate the polysilicon capacitor plates 370a, 370b, 370c, and 370d on the top of the fins 322, 324, and 326. This step is preferably the same process used to define the polysilicon gates of the FETs, thereby forming said gates concurrently with capacitor plates 370a, 370b, 370c, and 370d. Likewise, the processing used to form dielectric spacers proximate to the gates of a typical self-aligned FET process known to the art will concurrently form spacers 380a, 380b, 380c, 380d, 380e, and 380f. Spacers may be composed of any dielectric material, for example silicon nitride or silicon dioxide. The space between 370a and 370b may be reduced to allow spacers 380a and 380b to merge. Similarly, 380c and 380d may merge by suitable spacing of 372a and 372b and 380e and 380f may merge by suitable spacing of 370c and 370d. As illustrated in FIG. 3D, portions of the polysilicon layer 370 are removed such that only polysilicon members 370a, 370b, 370c, and 370d remain in the non self-aligned differential MOS varactor 300. The fin 322 is between the polysilicon members 370a and 370b; the fin 324 is between the polysilicon members 370b and 370c; and, the fin 326 is between the polysilicon members 370c and 370d. Notches 372a and 372b are in upper portions of the polysilicon members 370b and 370c, respectively.

Furthermore, spacers 380a and 380b are formed on sidewalls of the polysilicon members 370a and 370b, respectively, wherein the spacers 380a and 380b are between the polysilicon member 370a and the polysilicon member 370b. Spacers 380c and 380d are formed on sidewalls of the polysilicon members 370b and 370c, respectively, wherein the spacers 380c and 380d are between the notches 372a and 372b of the polysilicon member 370b and the polysilicon member 370c, respectively. Spacers 380e and 380f are formed on sidewalls of the polysilicon members 370c and 370d, respectively, wherein the spacers 380e and 380f are between the notch 372b of the polysilicon member 370c and the polysilicon member 370d.

Figure 3E:
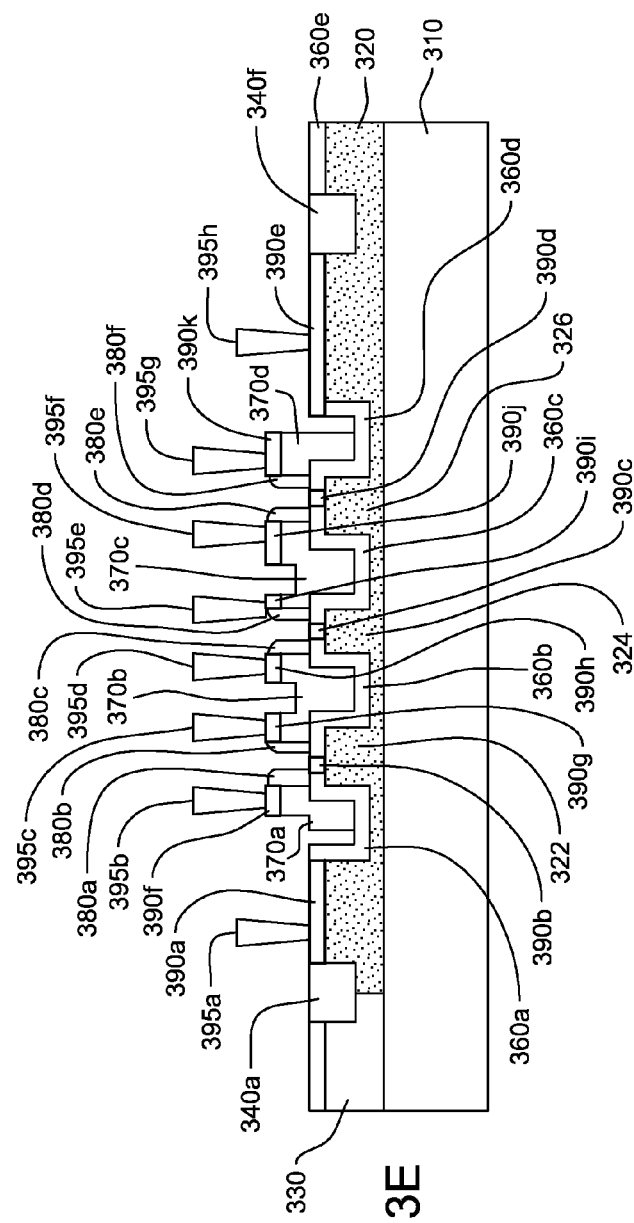

The method then implants an n+ dopant (preferably the same as that used for the FET source/drain) into the structure, and forms silicide and contacts. The contacts can be made at either the tops or bottoms of the fins. More specifically, as illustrated in FIG. 3E portions of the oxide layer 360 are removed such that only oxide members 360a, 360b, 360c, 360d, and 360e remain on the non self-aligned differential MOS varactor 300. The fin 322 is between the oxide members 360a and 360b; the fin 324 is between the oxide members 360b and 360c; the fin 324 is between the oxide members 360c and 360d; and, the STI region 340f is between the oxide members 360d and 360e. Moreover, the oxide member 360a is between the fin 322 and the polysilicon member 370a; the oxide member 360b is between the fins 322 and 324 the polysilicon member 370b; the oxide member 360c is between the fins 324 and 326 and the polysilicon member 370c; the oxide member 360d is between the fin 326 and the polysilicon member 370d; and, the oxide member 360e is on the NW layer 320 adjacent the STI region 340f.

Silicide members 390a, 390b, 390c, 390d, and 390e are formed on the NW layer 320, wherein the silicide member 390a is between the STI region 340a and the oxide member 360a, and wherein the silicide member 390b is between the oxide member 360a and the oxide member 360b. The silicide member 390c is between the oxide member 360b and the oxide member 360c; the silicide member 390d is between the oxide member 360c and the oxide member 360d; and, the silicide member 390e is between the oxide member 360d and the STI region 340f. Additionally, a silicide member 390f is formed on the polysilicon member 370a; silicide members 390g and 390h are formed on the polysilicon member 370b; silicide members 390i and 390j are formed on the polysilicon member 370c; and, a silicide member 390k is formed on the polysilicon member 370d. The notch 372a is between the silicide members 390g and 390h; and, the notch 372b is between the silicide members 390i and 390j. Furthermore, contacts 395a, 395b, 395c, 395d, 395e, 395f, 395g, and 395h (also referred to herein as "Vtune components" or "vertical anode plate(s)") are formed on the silicide members 390a, 390f, 390g, 390h, 390i, 390j, 390k, and 390e, respectively. Similar to the differential MOS varactor 100 shown in FIG. 1, each fin is between a pair of vertical anode plates.

FIGS. 4A-4B illustrate, in a view planar to the substrate (4A) and in section through the substrate (4B), a self-aligned differential MOS varactor 400 comprising an n-silicon layer 420 on a p-silicon substrate layer 410. The n-silicon layer 420 includes fins 422a, 422b, and 422c. An n+ region 430 is on a top surface of a first side of the n-silicon layer 420; and, an n+ region 432 is on a top surface of a second side of the n-silicon layer 420. An oxide layer 440 is also on the top surface of the n-silicon layer 420, between the source region 430 and the drain region 432, wherein the oxide layer 440 covers sidewalls and top surfaces of the fins 422a, 422b, and 422c.

Moreover, polysilicon members 450a, 450b, 450c, and 450d are on the oxide layer 440. Specifically, the fin 422a is between the polysilicon members 450a and 450b; the fin 422b is between the polysilicon members 450b and 450c; and, the fin 422c is between the polysilicon members 450c and 450d. Nitride members 460a, 460b, 460c, 460d, and 460e are on the oxide layer 440 not covered by the polysilicon members 450a, 450b, 450c, and 450d. The polysilicon member 450a is between the nitride members 460a and 460b; the polysilicon member 450b is between the nitride members 460b and 460c; the polysilicon member 450c is between the nitride members 460c and 460d; and, the polysilicon member 450d is between the nitride members 460d and 460e. Furthermore, the nitride members 460b, 460c, and 460d are over the fins 422a, 422b, and 422c, respectively.

The device also comprises anode contacts 470a, 470b, 470c, and 470d in upper recesses of the polysilicon members 450a, 450b, 450c, and 450d, respectively. Anode contacts 470a and 470c can be connected by a first conductor (not shown) by any manner known to the art. Anode contacts 470b and 470d are likewise connected by a second conductor (not shown). Thus the first conductor forms one anode terminal of the differential pair, and the second conductor forms the other anode terminal. Contacts 480b-480f comprise the Vtune terminal; the capacitance of the device may be modulated by varying the voltage potential on this terminal. Similar to the differential MOS varactor 100 shown in FIG. 1, each fin is between a pair of vertical anode plates.

Figure 5A:
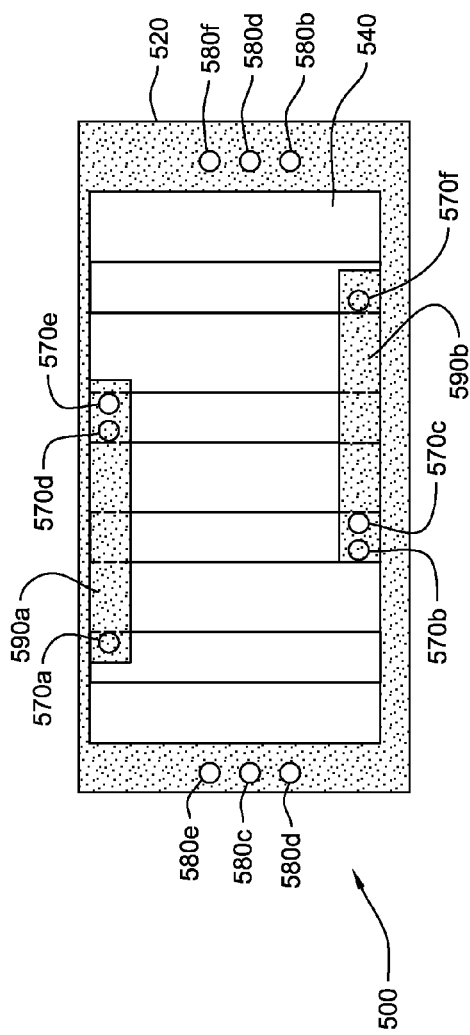
FIG. 5A is a diagram illustrating a top view of a non self-aligned differential MOS varactor.
Figure 5B:
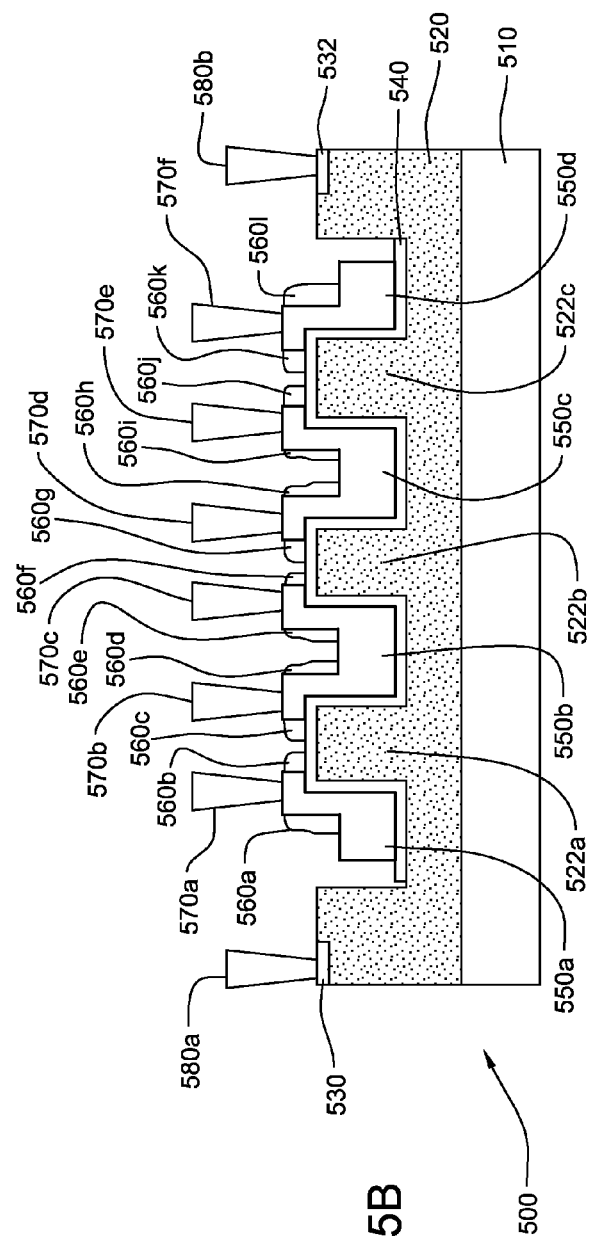
FIG. 5B is a diagram illustrating a cross-sectional view of the non self-aligned differential MOS varactor of FIG. 5A.

Referring now to FIGS. 5A-5B, a non self-aligned differential MOS varactor 500 is shown comprising an n-silicon layer 520 on a p-silicon substrate layer 510. The n-silicon layer 520 includes fins 522a, 522b, and 522c. An n+ region 530 is on a top surface of a first side of the n-silicon layer 520; and, an n+ region 532 is on a top surface of a second side of the n-silicon layer 520. An oxide layer 540 is also on the top surface of the n-silicon layer 520, between the source region 530 and the drain region 532, wherein the oxide layer 540 covers sidewalls and top surfaces of the fins 522a, 522b, and 522c.

Moreover, polysilicon members 550a, 550b, 550c, and 550d are on the oxide layer 540, wherein the polysilicon members 550a, 550b, 550c, and 550d are on sidewalls and upper edges of the fins 522a, 522b, and 522c. More specifically, the fin 522a is between the polysilicon members 550a and 550b; the fin 522b is between the polysilicon members 550b and 550c; and, the fin 522c is between the polysilicon members 550c and 550d. Spacers 560a and 560b are adjacent opposite sidewalls of the polysilicon member 550a; spacers 560c and 560f are adjacent opposite outer sidewalls of the polysilicon member 550b; spacers 560d and 560e are adjacent opposite inner sidewalls of the polysilicon member 550b; spacers 560g and 560j are adjacent opposite outer sidewalls of the polysilicon member 550c; spacers 560h and 560i are adjacent opposite inner sidewalls of the polysilicon member 550c; and, spacers 560k and 560l are adjacent opposite sidewalls of the polysilicon member 550d. The spacer 560a is over the polysilicon member 550a; the spacers 560b and 560c are over the fin 522a; the spacers 560d and 560e are over the polysilicon member 550b; the spacers 560f and 560g are over the fin 522b; the spacers 560h and 560i are over the polysilicon member 550c; the spacers 560j and 560k are over the fin 522c; and, the spacer 560l is over the polysilicon member 550d. A top portion of the polysilicon member 550a is between the spacers 560a and 560b; a first top portion of the polysilicon member 550b is between the spacers 560c and 560d; a second top portion of the polysilicon member 550b is between the spacers 560e and 560f; a first top portion of the polysilicon member 550c is between the spacers 560g and 560h; a second top portion of the polysilicon member 550c is between the spacers 560i and 560j; and, a top portion of the polysilicon member 550d is between the spacers 560k and 560l.

The device also comprises anode contacts 570a, 570b, 570c, 570d, 570e, and 570f on the top portion of the polysilicon member 550a, the first top portion of the polysilicon member 550b, the second top portion of the polysilicon member 550b, the first top portion of the polysilicon member 550c, the second top portion of the polysilicon member 550c, and the top portion of the polysilicon member 550d, respectively. Contacts 570a, 570d, and 570e are electrically connected by conductor 590a by any manner known to the art. Contacts 470b, 570c, and 570f are likewise connected by conductor 590b. Thus 590a comprises one anode of the differential pair and conductor 590b comprises the other anode of the differential pair. Vtune components 580a, 580c, and 580e are also provided on the n+ region 530; and, Vtune components 580b, 580d, and 580f are provided on the n+ region 532. Though four-anode devices are shown in the illustrations, the method and structure can be expanded to any number of anodes.

Accordingly, the embodiments of the invention provide a structure, method, etc. for a fin differential MOS varactor diode. More specifically, a differential varactor structure is provided comprising a substrate with an upper surface, a first vertical anode plate, and a second vertical anode plate electrically isolated from the first vertical anode plate. Moreover, a semiconductor fin comprising a cathode is between the first vertical anode plate and the second vertical anode plate, wherein the semiconductor fin, the first vertical anode plate, and the second vertical anode plate are each positioned over the substrate perpendicular to the upper surface of the substrate. As described above, the fin structure allows the two capacitors to be placed in close proximity. This reduces the parasitic resistance much further than could be achieved with an interdigitated planar structure.

Furthermore, a first insulator plate is provided between the first vertical anode plate and the semiconductor fin; and, a second insulator plate is provided between the second vertical anode plate and the semiconductor fin. As described above, FIG. 4B illustrates the oxide layer 440 on the top surface of the n-silicon layer 420, between the source region 430 and the drain region 432, wherein the oxide layer 440 covers sidewalls and top surfaces of the fins 422a, 422b, and 422c.

The structure may also include one or more additional vertical anode plates proximate the second vertical anode plate. For example, see the contacts 470c and 470d in FIGS. 4A-4B. Further, one or more additional semiconductor fins can be between the second vertical anode plate and the additional vertical anode plates. For example, see the fins 422b and 422c in FIG. 4B. The additional vertical anode plates and the additional semiconductor fins are positioned over the substrate perpendicular to the upper surface of the substrate. Moreover, a top of the first vertical anode plate, a top of the second vertical anode plate, and a top of the additional vertical anode plates are planar with each other. As described above, the non self-aligned differential MOS varactor 500 comprises the vertical anode plates 570a, 570b, 570c, 570d, 570e, and 570f on the top portion of the polysilicon member 550a, the first top portion of the polysilicon member 550b, the second top portion of the polysilicon member 550b, the first top portion of the polysilicon member 550c, the second top portion of the polysilicon member 550c, and the top portion of the polysilicon member 550d, respectively.

The structure may further include spacers between the semiconductor fin and the first vertical anode plate and the second vertical anode plate, wherein the spacers separate the semiconductor fin from the first vertical anode plate and the second vertical anode plate. As described above, FIG. 5B illustrates the non self-aligned differential MOS varactor 500, wherein the spacers 560a and 560b are adjacent opposite sidewalls of the polysilicon member 550a; the spacers 560c and 560f are adjacent opposite outer sidewalls of the polysilicon member 550b; the spacers 560d and 560e are adjacent opposite inner sidewalls of the polysilicon member 550b; the spacers 560g and 560j are adjacent opposite outer sidewalls of the polysilicon member 550c; the spacers 560h and 560i are adjacent opposite inner sidewalls of the polysilicon member 550c; and, the spacers 560k and 560l are adjacent opposite sidewalls of the polysilicon member 550d.

A method of forming a differential varactor structure is also provided, wherein the method begins by forming a substrate comprising an upper surface. Next, a semiconductor fin is formed over the substrate perpendicular to the upper surface of the substrate. As described above, with a first new mask level, a fin pattern is defined in photoresist when nitride and silicon are etched. Lithography and etch is similar to active area (RX) level.

First and second vertical anode plates are then formed proximate the semiconductor fin, such that the first and second vertical anode plates are over the substrate and perpendicular to the upper surface of the substrate. The first and second vertical anode plates are formed such that the semiconductor fin is between the second vertical anode plate and the first vertical anode plate, and such that the second vertical anode plate is electrically isolated from the first vertical anode plate. Thus, the forming of the semiconductor fin comprises forming the semiconductor fin such that the semiconductor fin allows the first vertical anode plate to be proximate and electrically isolated from the second vertical anode plate. As illustrated in FIG. 2D, the contact 290b is formed on the polysilicon member 270a; the contact 290c is formed on the polysilicon member 270b; the contact 290d is formed on the polysilicon member 270c; and, the contact 290e is formed on the polysilicon member 270d.

Prior to the forming of the first vertical anode plate and the second vertical anode plate, the method forms a first insulator plate and a second insulator plate, such that the first insulator plate is on a first sidewall of the semiconductor fin, and such that the second insulator plate is on a second sidewall of the semiconductor fin. The first and second insulator plates are formed such that the first insulator plate is between the semiconductor fin and the first vertical anode plate, and such that the second insulator plate is between the semiconductor fin and the second vertical anode plate. As described above, to minimize the thermal cycle, RTO or HiPOX may be performed to grow the thermal oxide.

Furthermore, prior to the forming of the first and second vertical anode plates, an insulator can be formed over the semiconductor fin. The forming of the first and second vertical anode plates can include forming the first and second vertical anode plates above the insulator, such that the insulator allows the first and second vertical anode plates to be self-aligned to a top of the semiconductor fin. As described above, portions of the nitride layer 250 are removed such that only the nitride members 250a, 250b, 250c, 250d, and 250e remain proximate the polysilicon members 270a, 270b, 270c, and 270d. The nitride members 250a and 250b are on opposite sidewalls of the polysilicon member 270a; the nitride members 250b and 250c are on opposite sidewalls of the polysilicon member 270b; the nitride members 250c and 250d are on opposite sidewalls of the polysilicon member 270c; and, the nitride members 250d and 250e are on opposite sidewalls of the polysilicon member 270d.

Also prior to the forming of the first and second vertical anode plates, spacers can be formed over the semiconductor fin. The forming of the first and second vertical anode plates can include forming the first and second vertical anode plates such that the spacers are between the semiconductor fin and the first and second vertical anode plates. As described above, FET spacer processing forms spacers. Groundrules may be modified to allow spacers to merge.

Additionally, the forming of the semiconductor fin includes forming one or more additional semiconductor fins over the substrate perpendicular to the upper surface of the substrate. The forming of the second vertical anode plate includes forming one or more additional vertical anode plates over the substrate perpendicular to the upper surface of the substrate, such that the additional semiconductor fin is between the second vertical anode plate and the additional vertical anode plate. As described above, the contacts 395b, 395c, 395d, 395e, 395f, and 395g are formed on the silicide members 390f, 390g, 390h, 390i, 390j, and 390k, respectively.

Figure 6A:
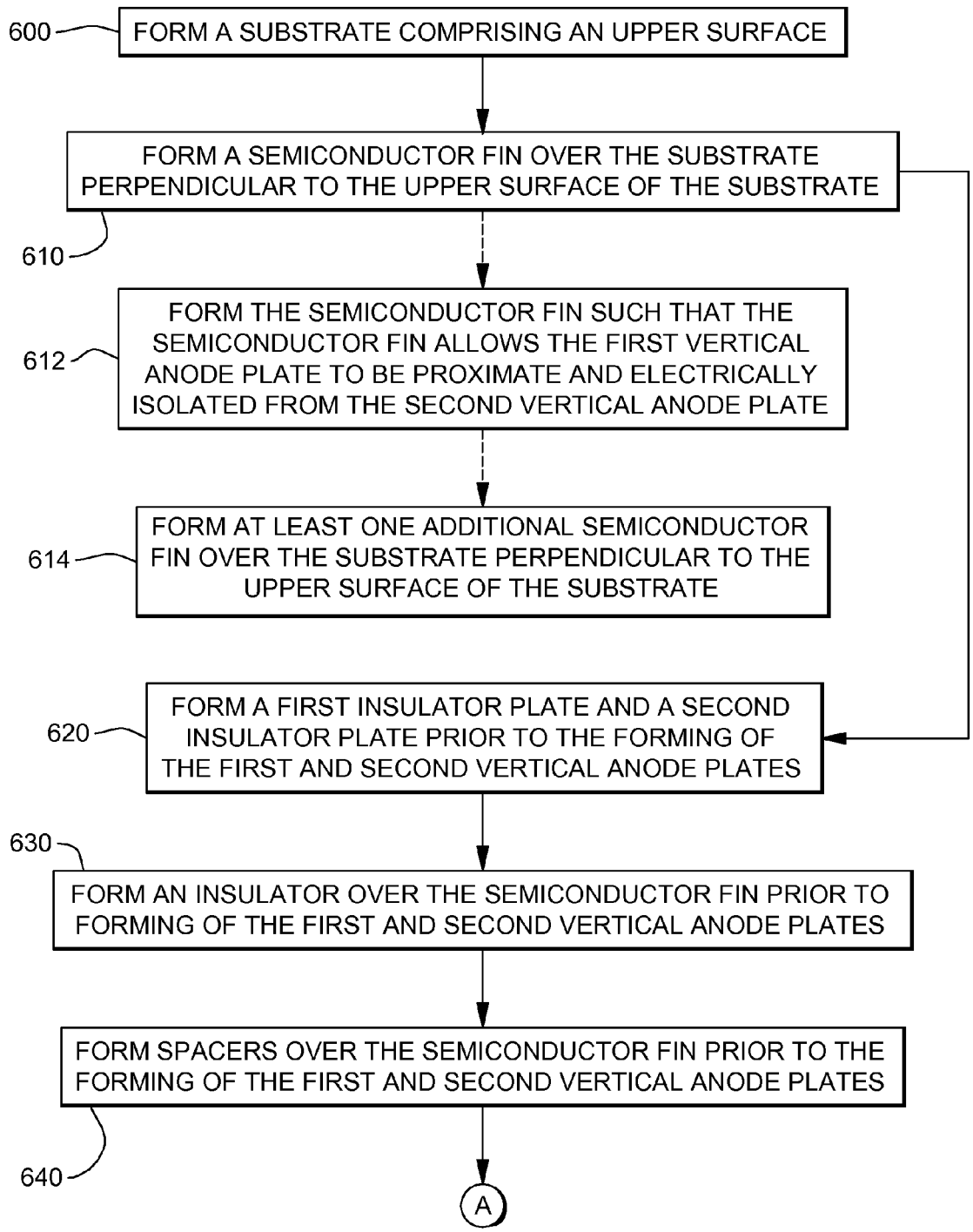
FIGS. 6A-6B are flow diagrams illustrating a method of forming a differential varactor structure.
Figure 6B:
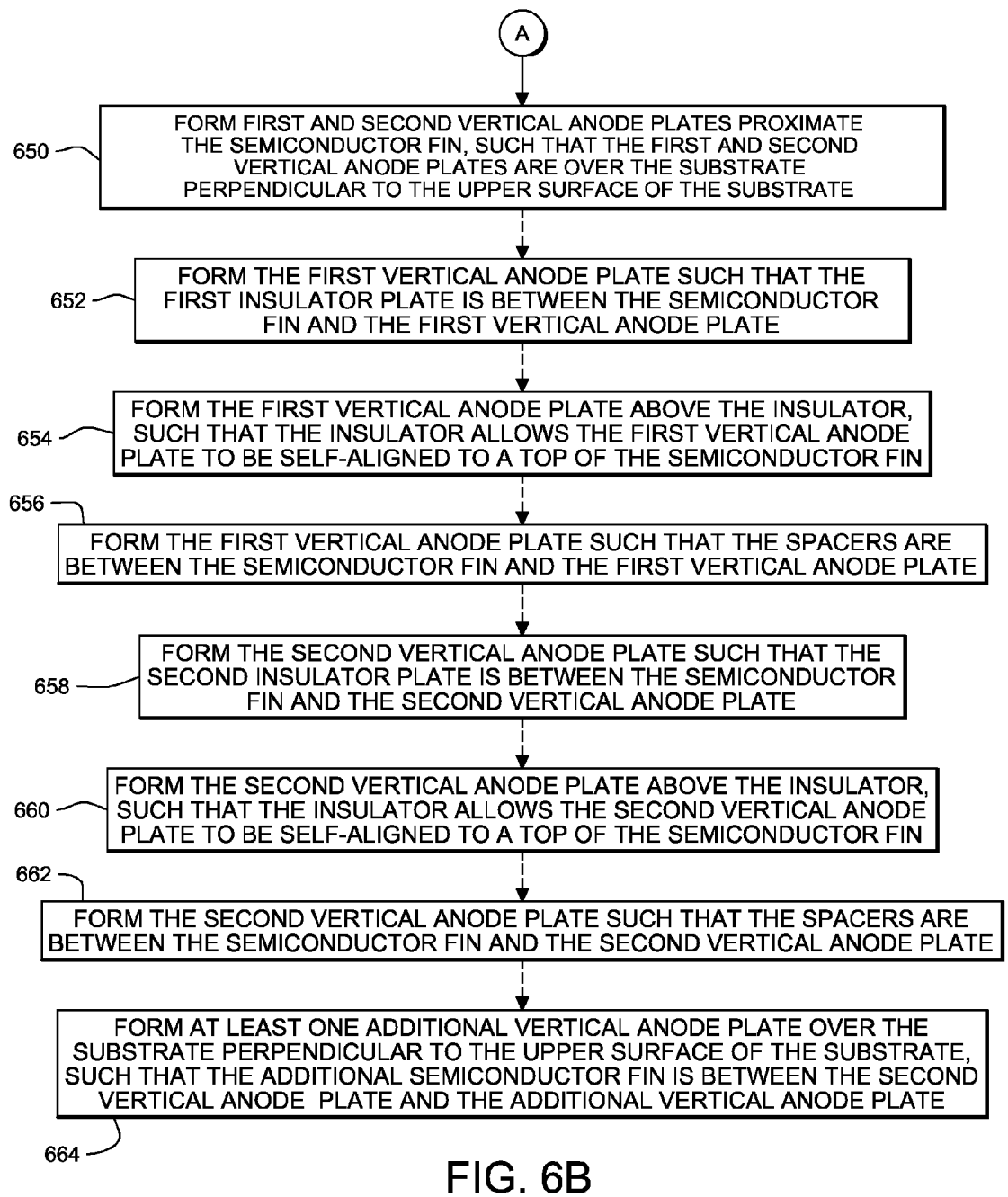

Referring now to FIGS. 6A-6B, flow diagrams of a method of forming a differential varactor structure are illustrated. The method begins in item 600 by forming a substrate comprising an upper surface. Next, in item 610, a semiconductor fin is formed over the substrate perpendicular to the upper surface of the substrate. As described above, with a first new mask level, a fin pattern is defined in photoresist when nitride and silicon are etched. Lithography and etch is similar to active area (RX) level. This involves, in item 612, forming the semiconductor fin such that the semiconductor fin allows the first vertical anode plate to be proximate and electrically isolated from the second vertical anode plate. Moreover, in item 614, at least one additional semiconductor fin is formed over the substrate perpendicular to the upper surface of the substrate. As illustrated in FIG. 2B, the fins 222, 224, and 226 are formed in the NW layer 220.

Subsequently, in item 620, a first insulator plate and a second insulator plate are formed prior to the forming of the first and second vertical anode plates. As illustrated in FIG. 2C, the oxide members 260a, 260b, 260c, and 260d are formed in the NW layer 220. The oxide members 260a and 260b are on opposite sidewalls of the fin 222; the oxide members 260b and 260c are on opposite sidewalls of the fin 224; and, the oxide members 260c and 260d are on opposite sidewalls of the fin 226.

Furthermore, in item 630, an insulator can be formed over the semiconductor fin prior to the forming of the first and second vertical anode plates. As described above, portions of the nitride layer 250 are removed such that only nitride members 250a, 250b, 250c, 250d, and 250e remain proximate the polysilicon members 270a, 270b, 270c, and 270d. The nitride members 250a and 250b are on opposite sidewalls of the polysilicon member 270a; the nitride members 250b and 250c are on opposite sidewalls of the polysilicon member 270b; the nitride members 250c and 250d are on opposite sidewalls of the polysilicon member 270c; and, the nitride members 250d and 250e are on opposite sidewalls of the polysilicon member 270d.

Additionally, in item 640, spacers can be formed over the semiconductor fin prior to the forming of the first and second vertical anode plates. As described above, FET spacer processing forms spacers. Groundrules may be modified to allow spacers to merge.

Following this, in item 650, first and second vertical anode plates are formed proximate the semiconductor fin, such that the first and second vertical anode plates are over the substrate and perpendicular to the upper surface of the substrate. As illustrated in FIG. 2D, the contact 290b is formed on the polysilicon member 270a; the contact 290c is formed on the polysilicon member 270b; the contact 290d is formed on the polysilicon member 270c; and, the contact 290e is formed on the polysilicon member 270d. This involves, in item 652, forming the first vertical anode plate such that the first insulator plate is between the semiconductor fin and the first vertical anode plate. Also, in item 654, the method forms the first vertical anode plate above the insulator, such that the insulator allows the first vertical anode plate to be self-aligned to a top of the semiconductor fin. Further, in item 656, the method can form the first vertical anode plate such that the spacers are between the semiconductor fin and the first vertical anode plate.

The first and second vertical anode plates are formed such that the semiconductor fin is between the second vertical anode plate and the first vertical anode plate, and such that the second vertical anode plate is electrically isolated from the first vertical anode plate. As described above, the contacts 395b, 395c, 395d, 395e, 395f, and 395g are formed on the silicide members 390f, 390g, 390h, 390i, 390j, and 390k, respectively. This involves, in item 658, forming the second vertical anode plate such that the second insulator plate is between the semiconductor fin and the second vertical anode plate. In addition, in item 660, the method forms the second vertical anode plate above the insulator, such that the insulator allows the second vertical anode plate to be self-aligned to a top of the semiconductor fin. Moreover, in item 662, the method forms the second vertical anode plate such that the spacers are between the semiconductor fin and the second vertical anode plate. Further, in item 664, at least one additional vertical anode plate is formed over the substrate perpendicular to the upper surface of the substrate, such that the additional semiconductor fin is between the second vertical anode plate and the additional vertical anode plate.

Accordingly, the embodiments of the invention form two electrically isolated vertical anode plates on opposite sides of a semiconductor fin structure. The silicon fin forms the common cathode. The fin structure allows the two capacitors to be placed in close proximity. This reduces the parasitic resistance much further than could be achieved with an interdigitated planar structure.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A differential varactor structure, comprising:
   a first fin formed from a n-type well (NW) layer and being disposed perpendicularly to and contacting a top surface of a p-type substrate;
   a first insulator formed on a top surface of said first fin;
   a second insulator formed on a first side and a second side of said first fin, said second insulator on each of said first and second sides contacting said top surface of said p-type substrate;
   a first conductor and a second conductor formed through said second insulator, each of said first conductor and said second conductor being lateral to and separate from said first and said second sides, respectively, of said first fin, said first and second conductors penetrating to a level above and separate from a bottom surface of said second insulator, and a top surface of each of said first and second conductors being co-planar with a top surface of said first insulator;
   a first vertical anode plate formed on and being perpendicular to said top surface of said first conductor, said first vertical anode plate being lateral to said first side of said first fin; and
   a second vertical anode plate formed on and being perpendicular to said top surface of said second conductor, said second vertical anode plate being lateral to said second side of said first fin and electrically isolated from said first vertical anode plate.

2. The structure according to claim 1, further comprising:
   a second fin formed from said n-type well (NW) layer and disposed perpendicularly to and contacting said top surface of said p-type substrate, said second fin having a first side and a second side corresponding to said first side and said second side of said first fin, said second fin being disposed laterally, in a direction from said first side to said second side of said first fin, to said second conductor and being separated from said second conductor by said second insulator;

a third conductor formed through said second insulator and being lateral to and separated from said second side of said second fin by said second insulator, said third conductor penetrating to a level above and separate from a bottom surface of said second insulator, and a top surface of said third conductor being co-planar with a top surface of said first insulator covering said second fin; and a third vertical anode plate formed on and perpendicular to said top surface of said second conductor, said third vertical anode plate being lateral to said second said of said second fin and electrically isolated from said second vertical anode plate.

3. The structure according to claim 2, a top of said third vertical anode plate being co-planar with a top surface of said first and second vertical anode plates.

4. The structure according to claim 3, wherein said first fin and said second fin comprise a cathode.

5. A differential varactor structure, comprising:

a first fin, a second fin, and a third fin formed from a n-type well (NW) layer, each said first fin, said second fin, and said third fin being separate and being disposed perpendicularly to and contacting a top surface of a p-type substrate;

a first insulator formed on a top surface of each of said first fin, said second fin, and said third fin;

a second insulator formed on a first side and a second side of each of said first fin, said second fin, and said third fin, said second insulator on each of said first and second sides contacting said top surface of said p-type substrate;

a first conductor formed laterally to said first side of said first fin, a second conductor formed between said first and second fins, a third conductor between said second and third fins, and a fourth conductor formed laterally to said second side of said third fin, each of said first, second, third, and fourth conductors being formed in said second insulator and penetrating to a level above and separate from a bottom surface of said second insulator, and a top surface of each of said first, second, third, and fourth conductors being co-planar with a top surface of said first insulator;

a first vertical anode plate, a second vertical anode plate, a third vertical anode plate, and a fourth vertical anode plate being formed on and being perpendicular to said top surface of said first, second, third, and fourth conductors, respectively, said first and third vertical anode plates being electrically isolated from said second and fourth vertical anode plates.

6. The structure according to claim 5, a top surface of each of said first, second, third, and fourth vertical anode plates being co-planar to each other.

7. A differential varactor structure, comprising:

at least two fins from a n-type well (NW) layer, each of said at least two fins being disposed perpendicularly to and contacting a top surface of a p-type substrate;

a first insulator formed on a top surface of each of said at least two fins;

a second insulator formed to a left side of a left-most of said at least two fins and to a right side of a right-most of said at least two fins, said second insulator also being interposed between each of said at least two fins and contacting said top surface of said p-type substrate;

a left body contact and a right body contact being formed from a top surface of said NW layer, said left and right body contacts being lateral to a left-most side and a right-most side of said second insulator;

a left-most vertical anode plate and a right-most vertical anode plate being formed on said left body contact and said right body contact, respectively, said left-most and said right-most vertical anode plates being electrically isolated;

at least three conductors formed in said second insulator, a left-most conductor and a right-most conductor being formed to lateral to and separate from said left-most and said right-most of said at least two fins, respectively, an interposing conductor being formed between each of said at least at least two fins, and a top surface of said at least three conductors being co-planar with a top surface of said first insulator; and an interposing vertical anode plate formed on each of said at least three conductors.

8. The structure according to claim 7, each pair of adjacent interposing vertical anode plates being electrically isolated from each other.

9. The structure according to claim 7, a top surface of each of said interposing vertical anode plates being co-planar with each other.

* * * * *

UNITED STATES PATENT AND TRADEMARK OFFICE
CERTIFICATE OF CORRECTION

PATENT NO. : 8,217,497 B2
APPLICATION NO. : 11/623922
DATED : July 10, 2012
INVENTOR(S) : Edward J. Nowak et al.

It is certified that error appears in the above-identified patent and that said Letters Patent is hereby corrected as shown below:

In the Specification

Column 1, line 3,

Please add the following paragraph after the title.

This invention was made with Government support under Contract Nos: N66001-03-X-6010, N66001-02-C-8011 and N66001-05-C-8013 awarded by Defense Advanced Research Projects Agency (DARPA). The government has certain rights in the invention.

Signed and Sealed this
Twenty-ninth Day of October, 2013

Teresa Stanek Rea
*Deputy Director of the United States Patent and Trademark Office*